United States Patent [19]

Shirai

[11] Patent Number: 5,640,348
[45] Date of Patent: Jun. 17, 1997

[54] NON-VOLATILE SEMICONDUCTOR MEMORY

[75] Inventor: Takayuki Shirai, Tokyo, Japan

[73] Assignee: NEC Corporation, Tokyo, Japan

[21] Appl. No.: 549,936

[22] Filed: Oct. 30, 1995

[30] Foreign Application Priority Data

Oct. 28, 1994 [JP] Japan ..................... 6-287195

[51] Int. Cl.$^6$ ..................................... G11C 7/00
[52] U.S. Cl. ................. 365/185.22; 365/189.05; 365/189.07
[58] Field of Search .............. 365/189.05, 189.07, 365/185.22, 185.23

[56] References Cited

U.S. PATENT DOCUMENTS 5,434,819 7/1995 Matsuo et al. ............ 365/189.07

*Primary Examiner*—Joseph A. Popek
*Attorney, Agent, or Firm*—Sughrue, Mion, Zinn, Macpeak & Seas

[57] ABSTRACT

There is provided non-volatile semiconductor memory a capable of performing an accurate program verify, by suppressing the power supply noise generated at the time of a program verify. An output buffer includes a mode discriminating circuit for discriminating an ordinary reading mode and a programming mode, and a load circuit. Connection/disconnection of the load circuit is determined by a NOR gate receiving a verify activation signal which is activated at the time of verify, in such a manner that the load circuit is put in a disconnected condition at the time of the ordinary reading, and in a connected condition at the time of the program verify.

5 Claims, 5 Drawing Sheets

NON-VOLATILE SEMICONDUCTOR MEMORY

BACKGROUND OF THE INVENTION

1. Field of the invention

The present invention relates to a semiconductor memory, and more specifically to an ultra violet erasable non-volatile semiconductor memory (called to"EPROM" in this specification).

2. Description of related art

FIG. 1 is a diagram illustrating a construction of the most typical conventional CMOS tristate output circuit. Referring to FIG. 1, this conventional output circuit 40 is constituted of an NAND circuit 42, a NOR circuit 44, driver gate input control circuits 46 and 46A, and a driver composed of a P-channel MOS transistor 47 and an N-channel MOS transistor 48. Outputs of the driver gate input control circuits 46 and 46A are connected to gates of the P-channel MOS transistor 47 and the N-channel MOS transistor 48, respectively, which have a drain thereof connected to each other. A connection node between the drains of the P-channel MOS transistor 47 and the N-channel MOS transistor 48 is a final output 49 of the output circuit.

A signal applied to an output buffer input 41 is applied to one input of the NAND circuit 42 and one input of the NOR circuit 44, respectively. The other input of the NOR circuit 44 is connected to receive an output buffer activation signal 45, and the other input of the NAND circuit 42 is connected to receive a signal by inverting the output buffer activation signal 45 by an inverter 43.

Now, operation of the above mentioned conventional output circuit will be described.

First, when the output buffer activation signal 45 is a low level, the output buffer input 41 is transferred through the NAND circuit 42 and the NOR circuit 44, and further is applied to the gates of the P-channel MOS transistor 47 and the N-channel MOS transistor 48 after the inclination of a rising waveform or a falling waveform of the signal is sharpness-deteriorated by the driver gate input control circuits 46 and 46A. Incidentally, the driver gate input control circuits 46 and 46A are formed of for example normally-on MOS transistors.

At this time, if the output buffer input 41 is at a high level, the output of the NAND circuit 42 is brought to the low level, so that the P-channel MOS transistor 47 is turned on. Furthermore, the output of the NOR circuit 44 is also brought to the low level, so that the N-channel MOS transistor 48 is turned off. Thus, the final output 49 is brought to the high level.

On the other hand, if the output buffer input 41 is at a low level, the output of the NAND circuit 42 is brought to the high level, so that the P-channel MOS transistor 47 is turned off. Furthermore, the output of the NOR circuit 44 is also brought to the high level, so that the N-channel MOS transistor 48 is turned on. Thus, the final output 49 is brought to the low level.

In addition, if the output buffer activation signal 45 is a high level, the output of the NAND circuit 42 is fixed to the high level, and the output of the NOR circuit 44 is also brought to the low level. Accordingly, both of the P-channel MOS transistor 47 and the N-channel MOS transistor 48 are off. Thus, the final output 49 is brought into a high impedance condition.

Next, a writing and a write verifying of the EPROM will be described with reference to FIG. 2.

Generally, the EPROM requires two external power supplies, namely, a reading power supply voltage (called Vcc) and a writing power supply voltage (called Vpp). It is the mainstream that Vcc is 5 V, similarly to other integrated circuits, and Vpp is 12.5 V at present.

First, at the time of writing, the voltages are risen up, from Vpp=Vcc=5.0 V at the time of an ordinary reading, to Vpp=12.5 V and Vcc=6.5 V (for example, even in a product having an ordinary reading Vcc range of 5.0 V ±0.5 V, Vcc is set to 6.0 V or in some time to 6.5 V in order to check a margin of a writing depth of a memory cell).

Thereafter, an address and data are inputted, and a chip enable signal $\overline{CE}$ (low active) is brought to a low level, ($\overline{CE}$="L") when an output enable signal $\overline{OE}$ is at a high level ($\overline{OE}$="H"), so as to execute a writing (this corresponds to "PROGRAM" in FIG. 2). At the time of $\overline{CE}$ ="H" and $\overline{OE}$="L", the write verifying (which is called a "program verify" as another expression, and which is simply called a "verify") is executed.

The "verify" is a mode in which the data written into the memory is read out in order to confirm the completion of the writing. An internal circuit of the integrated circuit operates in completely the same manner as the ordinary reading mode. In other words, it is equivalent to the reading mode in the case of a high Vcc.

Thereafter, an operation similar to the above mentioned operation is repeated until a last address (while Vpp and Vcc are fixed). Thus, the writing is completed.

Conventionally, the program (the period of $\overline{CE}$="L") is a few hundred microseconds, and the program verify ($\overline{OE}$="L") is a few microseconds.

As mentioned above, in the verify in the course of the writing operation of the conventional EPROM, Vcc is set to a level higher than a rated voltage for the ordinary reading, in order to check the margin of the writing depth of the memory cell.

Because of this, a problem has been encountered in which, fluctuation of Vcc and a ground level (GND) caused by a change of output data of the integrated circuit (power supply noise) becomes larger than that in the ordinary reading, and this fluctuation is propagated to a sense amplifier and an address buffer, thereby causing a data verify error.

More specifically, a closed loop is formed among the address buffer →the sense amplifier → the output buffer, so that oscillation occurs Even if the period of the verify is elongated, the output of the integrated circuit cannot be properly read out.

SUMMARY OF THE INVENTION

Accordingly, it is an object of the present invention to provide a semiconductor memory which has overcome the above mentioned defect of the prior art.

Another object of the present invention is to provide a semiconductor memory, capable of performing an accurate program verify by suppressing a power supply noise occurring at the time of the program verify.

The above and other objects of the present invention are achieved by a non-volatile semiconductor memory including an output circuit having a P-channel MOS transistor having a source thereof connected to a power supply and an N-channel MOS transistor having a source thereof connected to ground, drains of the P-channel MOS transistor and the N-channel MOS transistor being connected in common so as to form a final output, the semiconductor memory having an ordinary data reading mode and a programming mode accompanied with a verify operation, and the semiconductor memory also including gate input signal driving circuits for driving a gate of the P-channel MOS transistor and a gate of the N-channel MOS transistor, characterized in that each of the gate input signal driving circuit for the P-channel MOS transistor and the gate input signal driving circuit for the N-channel MOS transistor is provided with a load circuit and a mode discriminating circuit for discriminating the reading mode and the programming mode.

In the non-volatile semiconductor memory in accordance with the present invention, preferably, connection/disconnection of the load circuits to the gate input signal driving circuit for the P-channel MOS transistor and the gate input signal driving circuit for the N-channel MOS transistor, is controlled by the result of discrimination of the mode discriminating circuit.

Furthermore, according to the present invention, there is provided a non-volatile semiconductor memory including an output circuit having a P-channel MOS transistor having a source thereof connected to a power supply and an N-channel MOS transistor having a source thereof connected to ground, drains of the P-channel MOS transistor and the N-channel MOS transistor being connected in common so as to form a final output, the semiconductor memory having an ordinary data reading mode and a programming mode accompanied with a verify operation, and the semiconductor memory also including gate input signal driving circuits for driving a gate of the P-channel MOS transistor and a gate of the N-channel MOS transistor, and characterized in that each of the gate input signal driving circuit for the P-channel MOS transistor and the gate input signal driving circuit for the N-channel MOS transistor, has a high speed path, a low speed path and a switch-over controlling circuit for switching between the high speed path and the low speed path.

In the non-volatile semiconductor memory in accordance with the present invention, preferably, a selective connection of each of the gate input signal driving circuit for the P-channel MOS transistor and the gate input signal driving circuit for the N-channel MOS transistor, to either the high speed path or the low speed path, is controlled by the result of discrimination of a mode discriminating circuit for discriminating the reading mode and the programming mode.

In addition, according to the present invention, there is provided a non-volatile semiconductor memory including an output circuit having a P-channel MOS transistor having a source thereof connected to a power supply and an N-channel MOS transistor having a source thereof connected to ground, drains of the P-channel MOS transistor and the N-channel MOS transistor being connected in common so as to form a final output, the semiconductor memory having an ordinary data reading mode and a programming mode accompanied with a verify operation, and the semiconductor memory also including gate input signal driving circuits for driving a gate of the P-channel MOS transistor and a gate of the N-channel MOS transistor, characterized in that, in the verify operation, each of the gate input signal driving circuit for the P-channel MOS transistor and the gate input signal driving circuit for the N-channel MOS transistor, constitutes a high cut filter for attenuating a predetermined high frequency component.

With the above mentioned arrangement, the degree of sharpness-deterioration of the signal waveform applied to a gate of a final output transistor is controlled by the mode discriminating circuit for discriminating the ordinary reading mode and the programming mode accompanied with the verify operation. Thus, even if the power supply voltage Vcc is set to a level higher than the rated voltage for the ordinary reading for the purpose of a margin checking of the write depth in the memory cell, it is possible to perform an accurate data verify, at the time of the write verify, without being influenced by the power supply noise, by action of the driver gate input control circuit which acts as the high cut filter in the output buffer.

Furthermore, according to the present invention, since the pulse width of the noises which can be cut off, is determined by a speed difference between the high speed path and the low speed path, it is possible to perform an accurate data verify, at the time of write verifying, without being influenced by the power supply noise.

DESCRIPTION OF THE PREFERRED EMBODIMENTS

Now, embodiments of the present invention will be described with reference to the accompanying drawings.

Figure 3:
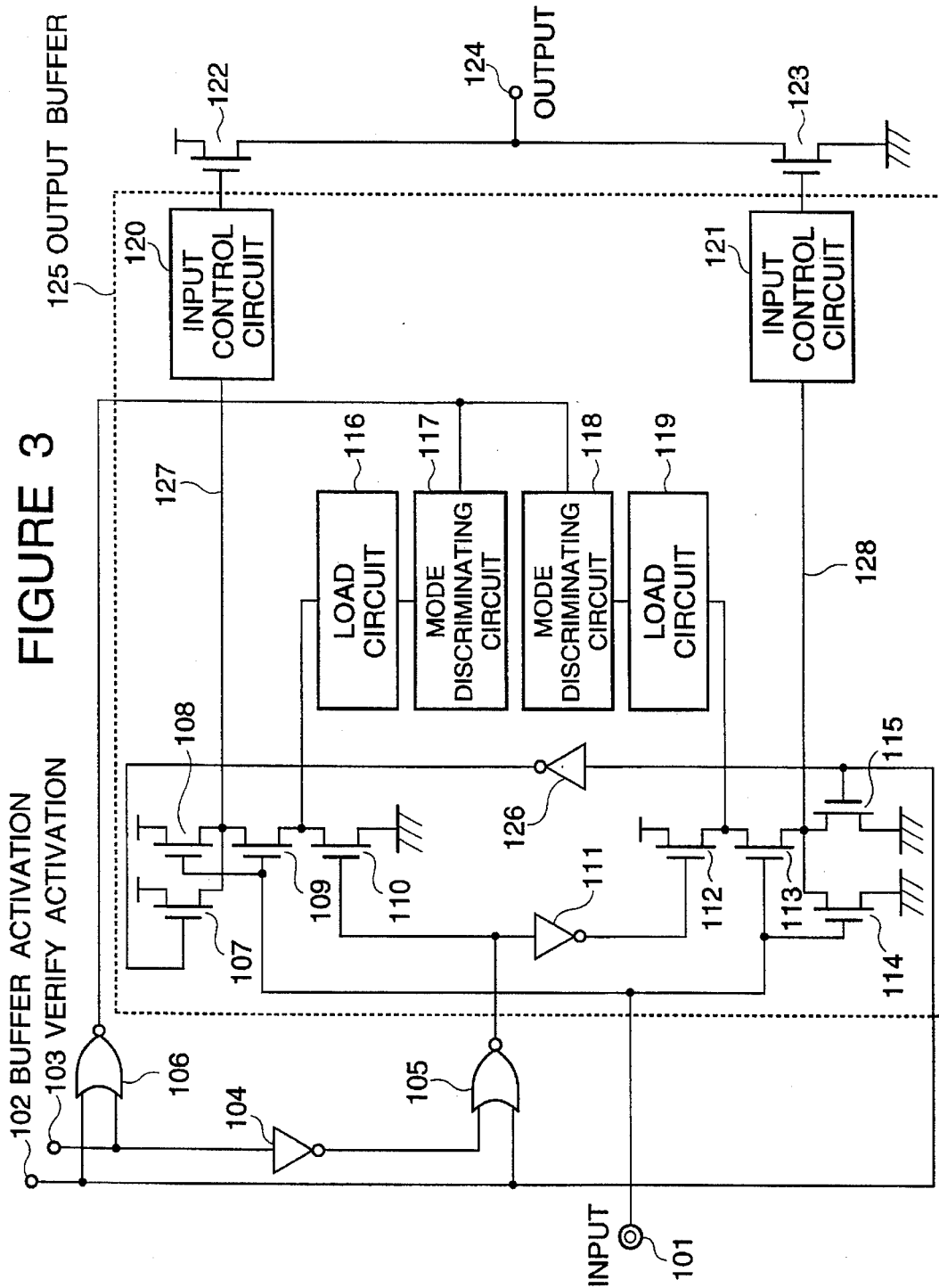
FIG. 3 is a circuit diagram illustrating the construction of a first embodiment of the semiconductor memory in accordance with the present invention.

FIG. 3 is a diagram illustrating the construction of the first embodiment of the present invention.

Referring to FIG. 3, an output buffer in accordance with this embodiment includes a NOR circuit 105 receiving an output buffer activation signal 102 and a signal obtained by inverting a verify activation signal 103 by an inverter 104, another NOR circuit 106 receiving the output buffer activation signal 102 and the verify activation signal 103, an NAND type circuit (corresponding to the NAND circuit 42 in FIG. 1) composed of P-channel transistors 107 and 108 and N-channel transistors 109 and 110, a NOR type circuit (corresponding to the NOR circuit 44 in FIG. 1) composed of P-channel transistors 112 and 113 and N-channel transistors 114 and 115, mode discriminating circuits 117 and 118 connected to an output of the NOR circuit 106, a load circuit 116 connected between the mode discriminating circuit 117 and a connection node between the N-channel transistors 109 and 110, another load circuit 119 connected between the mode discriminating circuit 118 and a connection node between the P-channel transistors 111 and 113, driver gate input control circuits 120 and 121, and a driver composed of a P-channel transistor 122 and an N-channel transistor 123. Outputs of the driver gate input control circuits 120 and 121 are connected to gates of the P-channel MOS transistor 122 and the N-channel MOS transistor 123, respectively, which have a drain thereof connected to each other. A connection node between the drains of the P-channel MOS transistor 122 and the N-channel MOS transistor 123 is a final output 124 of the output circuit.

The P-channel MOS transistor 107 has a gate thereof connected to receive a signal obtained by inverting the output buffer activation signal 102 by an inverter 126. Gates of the P-channel MOS transistor 108 and the N-channel MOS transistor 109 are connected to an output buffer input 101. An output of the NOR circuit 105 is connected to a gate of the N-channel MOS transistor 110.

Drains of the P-channel MOS transistors 107 and 108 are connected in common to a drain of the N-channel MOS transistor 109, and constitutes an output 127 of the NAND type circuit, which is in turn connected to an input of the driver gate input control circuit 120.

The N-channel MOS transistor 115 has a gate thereof connected to receive the output buffer activation signal 102, and the output buffer input 101 is connected to gates of the P-channel MOS transistor 113 and the N-channel MOS transistor 114, respectively. The output of the NOR circuit 105 is connected through an inverter 111 to a gate of the P-channel MOS transistor 112.

Drains of the P-channel MOS transistor 113 and the N-channel MOS transistors 114 and 115 are connected in common to constitute an output 128 of the NOR type circuit, which is in turn connected to an input of the driver gate input control circuit 121.

The verify activation signal 102 is brought to a low level when a Vpp terminal is brought to 12.5 V. Incidentally, a circuit for comparing Vpp with the power supply voltage Vcc so as to detect that Vpp has been brought to a writing level, brought to a writing level, is generally used in EPROMs, and therefore explanation thereof will be omitted.

The mode discriminating circuits 117 and 118 are a circuits for indentifying whether the condition is in a writing mode or in an ordinary reading mode. The mode discriminating circuits 117 and 118 receive the verify activation signal 103 for putting the load circuits 116 and 119 into a disconnected condition at the time of the ordinary reading and into a connected condition during the writing period (including the verify).

The mode discriminating circuit 117 is constituted of for example an N-channel MOS transistor having a gate thereof connected to the output of the NOR circuit 106, a drain thereof connected to the load circuit 116 and a source thereof connected to ground. The mode discriminating circuit 118 is constituted of for example a P-channel MOS transistor having a gate thereof connected to receive an inverted signal of the output of the NOR circuit 106, a drain thereof connected to the load circuit 119 and a source thereof connected to a power supply voltage. In addition, the load circuits 116 and 119 are constituted of a normally-on MOS transistor, such as a P-channel MOS transistor having a gate thereof and a source thereof connected to each other, or an N-channel MOS transistor having a gate thereof and a drain thereof connected to each other.

Now, operation of this embodiment will be described.

At the time of the ordinary reading, the output buffer activation signal 102 (low active) is brought to the low level, so as to turn off the N-channel MOS transistor 115, and also to turn off the P-channel MOS transistor 107 through the inverter 126. Furthermore, at the time of the ordinary reading, the verify activation signal 103 (low active) is brought to a high level, and therefore, the NOR circuit 106 outputs the low level. Accordingly, the mode discriminating circuits 117 and 118 identify that the operation is in the reading mode, and therefore, put the load circuits 116 and 119 in the disconnected condition.

On the other hand, the NOR circuit 105 receiving the signal obtained by inverting the verify activation signal 103 by the inverter 104, outputs the high level so as to turn on the N-channel MOS transistor 110, and also to turn on the P-channel MOS transistor 112 which receives at its gate the inverted signal of the output of the NOR circuit 105.

At this time, if the output buffer input 101 is at the high level, the output 127 of the NAND type circuit is brought to the low level, which turns on the P-channel MOS transistor 122, and the output 128 of the NOR type circuit is brought to the low level, which turns off the N-channel MOS transistor 123. Thus, the final output 124 is brought to the high level.

On the other hand, if the output buffer input 101 is at the low level, the output 127 of the NAND type circuit is brought to the high level, which turns off the P-channel MOS transistor 122, and the output 128 of the NOR type circuit is brought to the high level, which turns on the N-channel MOS transistor 123. Thus, the final output 124 is brought to the low level.

Furthermore, when the output buffer activation signal 102 is brought to the high level, both the N-channel MOS transistor 115 and the P-channel MOS transistor 107 are turned on, so that, regardless of the level of the output buffer input 101, the output 127 of the NAND type circuit is brought to the high level and the output 128 of the NOR type circuit is brought to the low level. Therefore, both the P-channel MOS transistor 122 and the N-channel MOS transistor 127 are off, so that the final output 124 is put in a high impedance condition.

Figure 2:
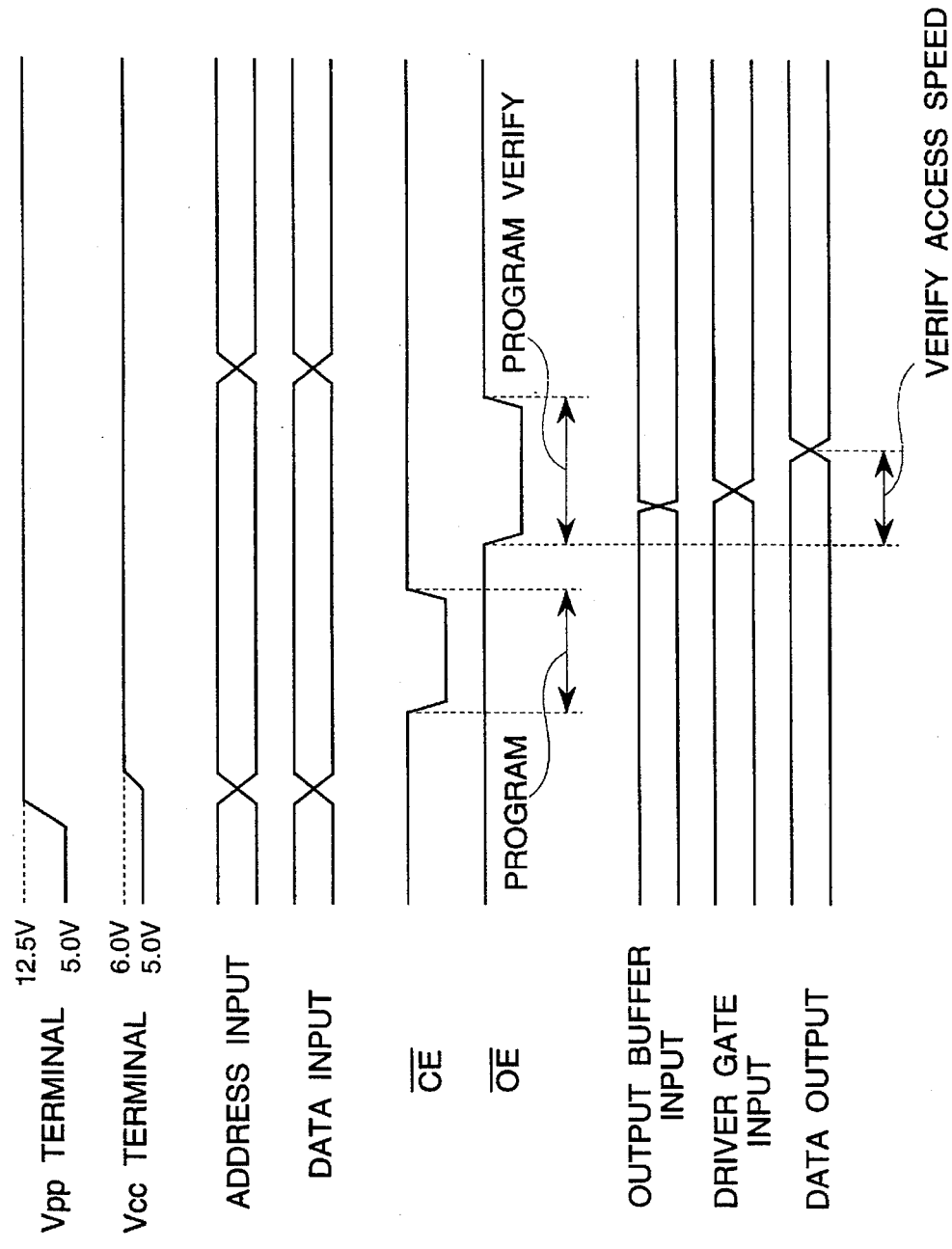
FIG. 2 is a timing chart illustrating signal waveforms at the time of a programming operation of the conventional EPROM.

The signal waveform in the ordinary reading is similar to the driver gate input in response to the input of the output buffer of the conventional example explained hereinbefore with reference to FIG. 2. Namely, the sharpness-deterioration of the waveform of the signal applied to the driver gate depends upon the driver gate input control circuits 120 and 121.

At the time of the verify, the output buffer activation signal 102 is brought to the low level, which turns off the N-channel MOS transistor 115, and the inverted signal of the output buffer activation signal 102 turns off the P-channel MOS transistor 107. Furthermore, at the time of the verify, since the verify activation signal 102 is brought to the low level (namely, activated), the NOR circuit 106 outputs the high level, so that the mode discriminating circuits 117 and 118 discriminate that the operation is in the verify mode and therefore put the load circuits 116 and 119 in the connected condition.

Furthermore, the NOR circuit 105 outputs the low level, which turns off the N-channel MOS transistor 110, and also turns off the P-channel MOS transistor 112 having the gate thereof receiving the signal obtained by inverting the output of the NOR circuit 105 by the inverter 111.

Figure 5:
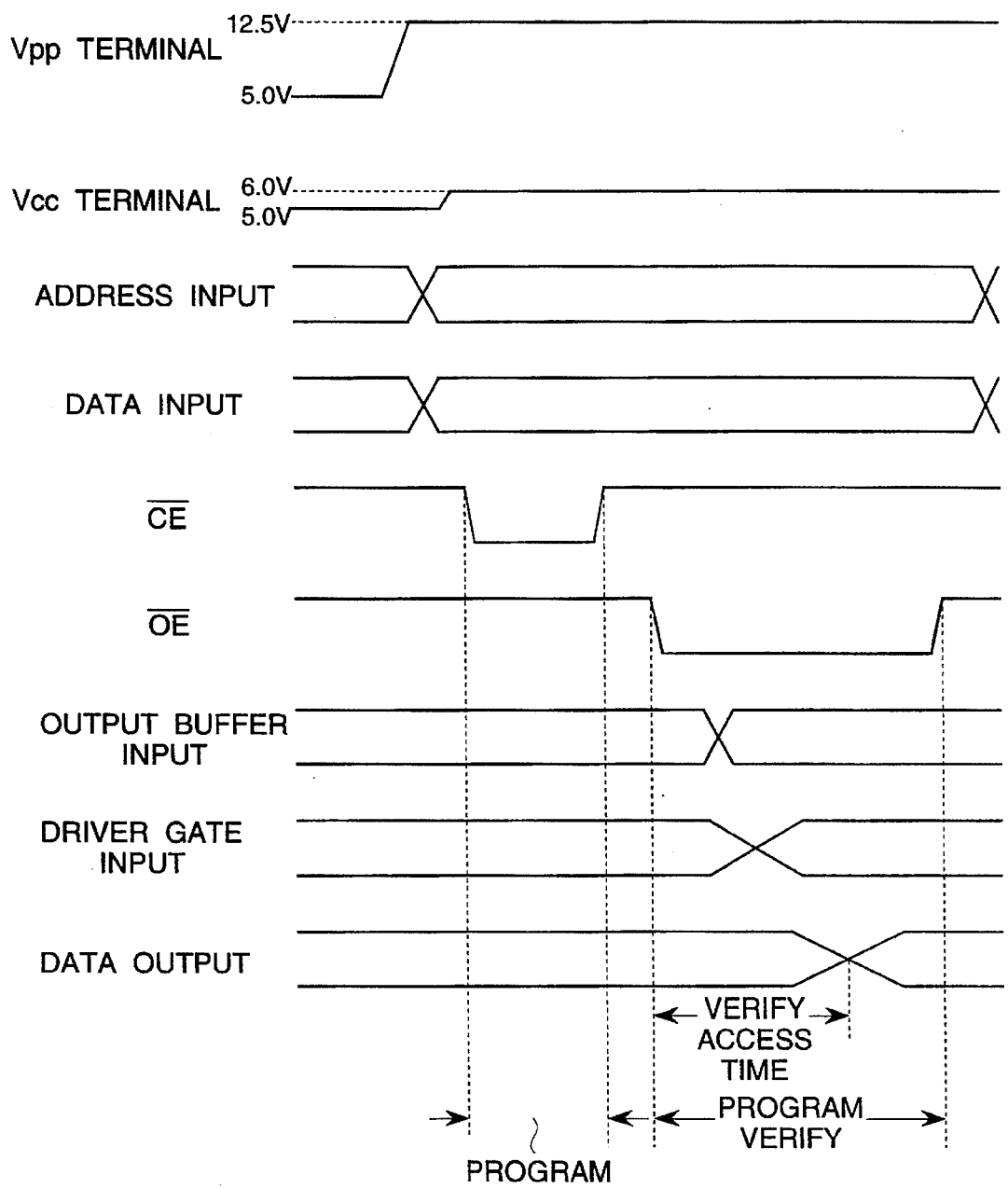
FIG. 5 is a timing chart illustrating signal waveforms at the time of a programming operation in one embodiment of the present invention.

Signals waveforms at this time are shown in FIG. 5. As shown in FIG. 5, a rising waveform and a falling waveform of the driver gate input signal are sharpness-deteriorated as compared with the waveform of the signal of the output buffer input. The degree of sharpness-deterioration of the waveform of the driver gate input signal becomes further larger than that in the ordinary reading. Namely, the NAND type circuit shown in FIG. 3 makes, by the connection of the load circuit 116, the inclination of the falling waveform of the output 128 larger than that of the ordinary reading (namely, enlarges the degree of sharpness-deterioration). The NOR type circuit makes, by the connection of the load circuit 119, the inclination of the rising waveform of the output 129 larger than that of the ordinary reading (namely, enlarges the degree of sharpness-deterioration).

As has been explained with reference to FIG. 2, it is sufficient if the data output is read out for a few microseconds in the verify operation during the writing period. In this embodiment, the output buffer 125 is constituted to operate as a high cut filter which absorbs the noise caused by the output driver operation during a period of a few nanoseconds to a few ten nanoseconds.

The high cut filter (which is called a "low pass filter" as another expression) is a filter for cutting off a high frequency component. A continuation period of the fluctuation of the power supply voltage Vcc and the ground level (GND) caused by the change of the output data of the integrated circuit is on the order of a few nanoseconds to a few ten nanoseconds, and therefore, in this embodiment, the high cut filter is a circuit for cutting off a signal having a width on the order of a few nanoseconds to a few ten nanoseconds. For example, in the circuit shown in FIG. 3, the width of noise pulses which can be cut off, is determined by a time constant of the load circuits 116 and 119 and the driver gate input control circuits 120 and 121.

Figure 4:
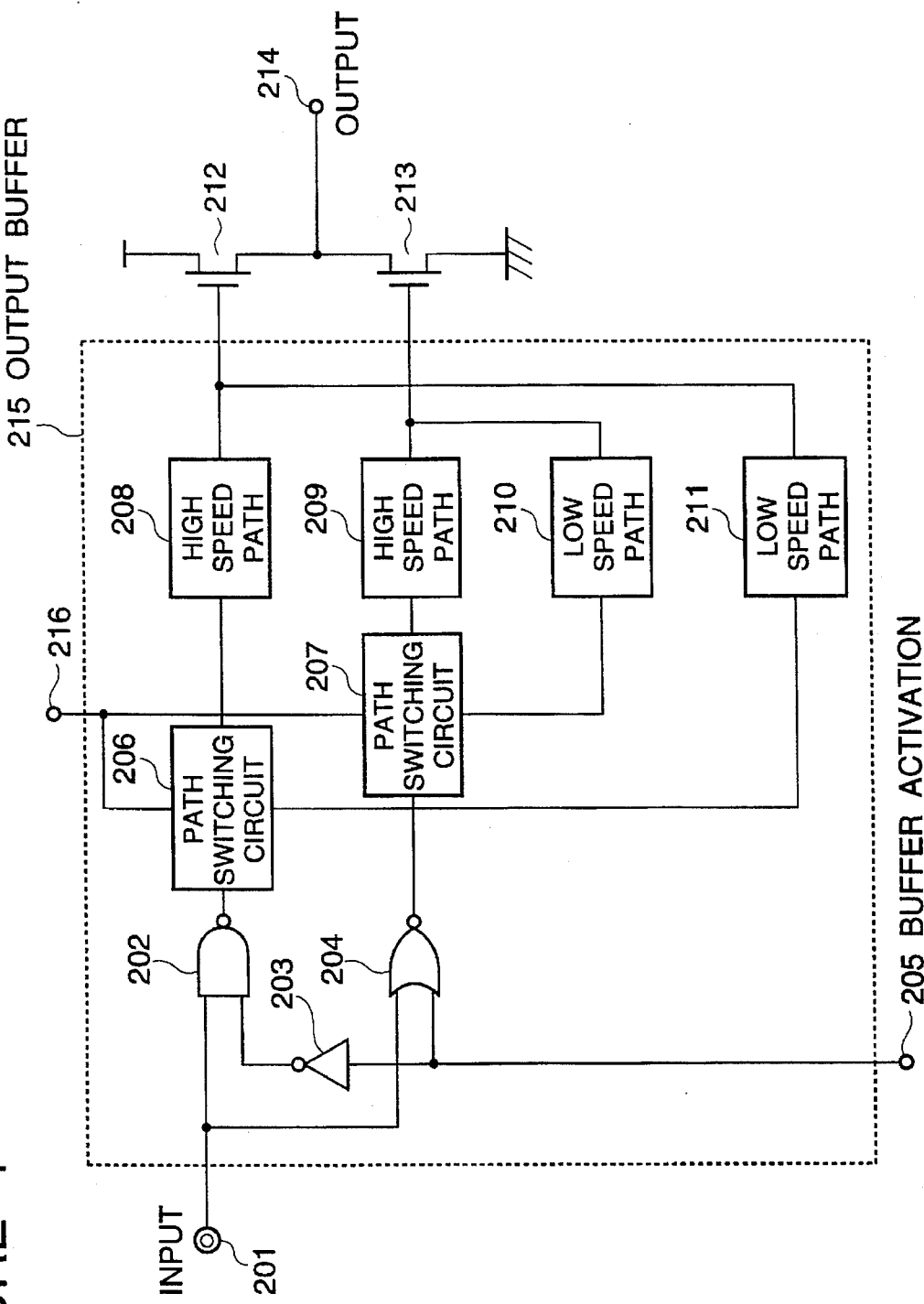
FIG. 4 is a circuit diagram illustrating the construction of a second embodiment of the semiconductor memory in accordance with the present invention.

FIG. 4 is a diagram illustrating the construction of a second embodiment of the present invention. The following description will be focused on a difference between the embodiment shown in FIG. 4 and the conventional example explained hereinbefore with reference to FIG. 1.

Figure 1:
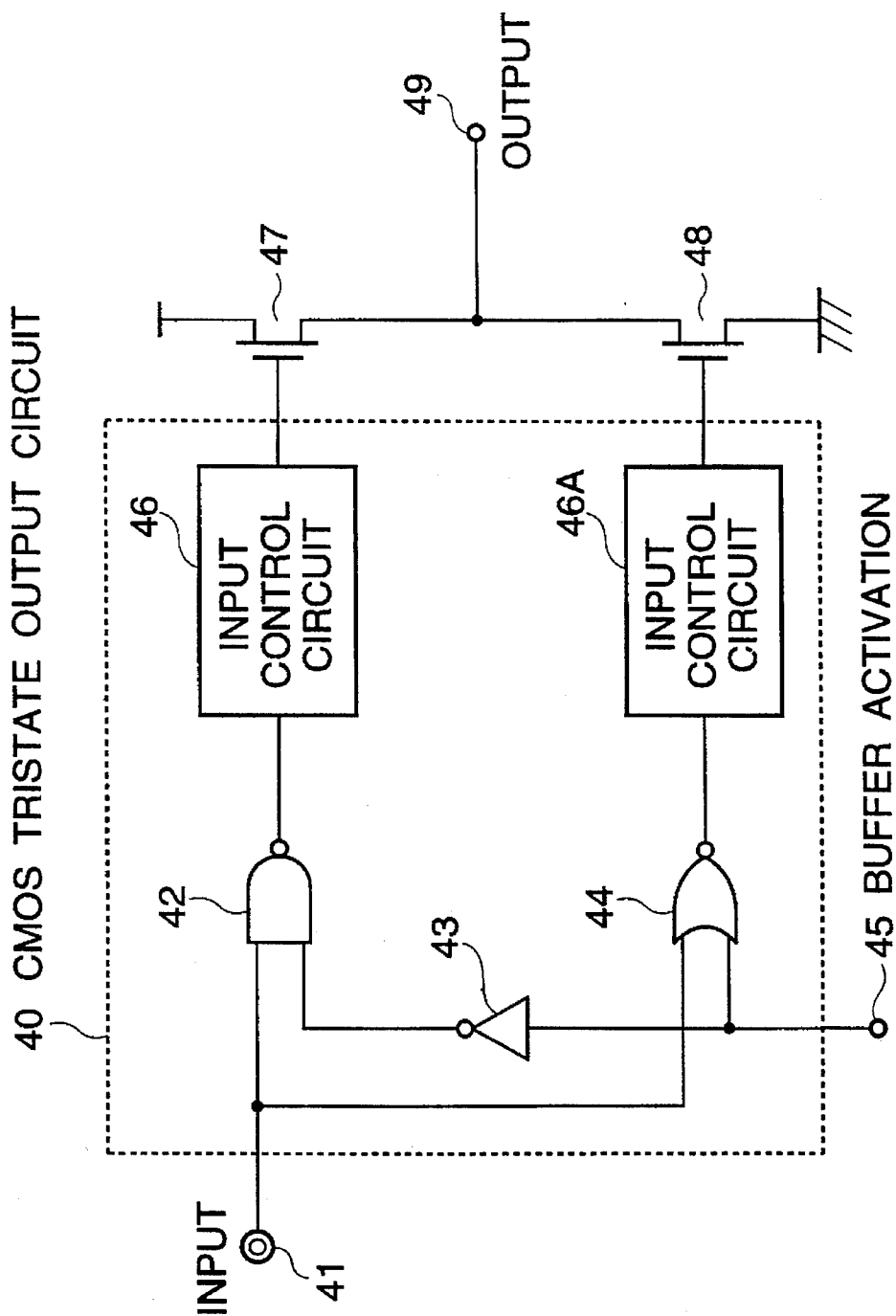
FIG. 1 is a circuit diagram illustrating an output circuit of a conventional EPROM.

In addition to the conventional example explained hereinbefore and shown in FIG. 1, the embodiment shown in FIG. 4 receives a driver gate input path switching signal 216 and includes driver gate input path switching circuits 206 and 207, driver gate input high speed paths 208 and 209 and driver gate input low speed path 210 and 211.

In the ordinary reading, a signal applied to an output buffer input 201 is transferred through a NAND circuit 202 and a NOR circuit 204, and also through the driver gate input high speed paths 208 and 209. In the verifying, the driver gate input path switching circuits 206 and 207 are switched by the driver gate input path switching signal 216, so that the signal is passed through the driver gate input low speed path 210 and 211.

The driver gate input path switching circuits 206 and 207 are constituted of a mode discriminating circuit which receives, as the driver gate input path switching signal 216, the verify activation signal 103 described in connection with the first embodiment, and which discriminates the ordinary reading mode and the verify mode. In addition, the driver gate input high speed paths 208 and 209 are constituted of a low pass filter composed of a CR integrating circuit, and the driver gate input low speed path 210 and 211 are constituted of an increased number of cascaded stages of CR integrating circuits. In this case, a resistive load can be formed of a normally-on MOS transistor.

In the embodiment shown in FIG. 4, the pulse width of the noises which can be cut off, is determined by a speed difference between the high speed path and the low speed path.

The invention has thus been shown and described with reference to the specific embodiments. However, it should be noted that the present invention is in no way limited to the details of the illustrated structures but various embodiments, changes and modifications based on the principle of the present invention will be included in the spirit of the present invention.

As seen from the above description, according to the present invention, even if the power supply voltage Vcc is set to a level higher than the rated voltage for the ordinary reading for the purpose of a margin checking of the write depth in the memory cell, it is possible to perform an accurate data verify at the time of write verifying, without being influenced by the power supply noise, by action of the driver gate input control circuit which acts as the high cut filter in the output buffer.

Furthermore, according to the present invention, since the connection/disconnection of the load circuit is controlled by the mode discriminating circuit for discriminating the ordinary reading mode and the verify mode, the present invention is advantageous since it is possible to remarkably reduce the power supply noise while greatly suppressing the increase of the circuit size.

In addition, according to the present invention, since the pulse width of the noises which can be cut off, is determined by a speed difference between the high speed path and the low speed path, it is possible to perform an accurate data verify at the time of write verifying, without being influenced by the power supply noise.

Moreover, the present invention has an advantage in which the signal path is switched between the high speed path and the low speed path by the mode discriminating circuit for discriminating the ordinary reading mode and the verify mode, it is possible to remarkably reduce the power supply noise at the time of switching while greatly suppressing the increase of the circuit size.

And, according to the present invention, in the verifying operation, the circuit for driving the driver is switched and controlled to form a high cut filter, and therefore, even if the power supply voltage Vcc is set to a level higher than the rated voltage for the ordinary reading, it is possible to perform an accurate data verify at the time of write verifying, without being influenced by the power supply noise, while greatly suppressing the increase of the circuit size.

I claim:

1. A non-volatile semiconductor memory including an output circuit having a P-channel MOS transistor having a source thereof connected to a power supply and an N-channel MOS transistor having a source thereof connected to ground, drains of said P-channel MOS transistor and said N-channel MOS transistor being connected in common so as to form a final output, the semiconductor memory having an ordinary data reading mode and a programming mode accompanied with a verify operation, and the semiconductor memory also including gate input signal driving circuits for driving a gate of said P-channel MOS transistor and a gate of said N-channel MOS transistor, characterized in that each of said gate input signal driving circuit for said P-channel MOS transistor and said gate input signal driving circuit for said N-channel MOS transistor is provided with a load circuit and a mode discriminating circuit for identifying operations in the reading mode and the programming mode.

2. A non-volatile semiconductor memory claimed in claim 1 wherein connection/disconnection of said load circuits to said gate input signal driving circuit for said P-channel MOS transistor and said gate input signal driving circuit for said N-channel MOS transistor, is controlled by the mode discriminating circuit.

3. A non-volatile semiconductor memory including an output circuit having a P-channel MOS transistor having a source thereof connected to a power supply and an N-channel MOS transistor having a source thereof connected to ground, drains of said P-channel MOS transistor and said N-channel MOS transistor being connected in common so as to form a final output, the semiconductor memory having an ordinary data reading mode and a programming mode accompanied with a verify operation, and the semiconductor memory also including gate input signal driving circuits for driving a gate of said P-channel MOS transistor and a gate of said N-channel MOS transistor, and characterized in that each of said gate input signal driving circuit for said P-channel MOS transistor and said gate input signal driving circuit for said N-channel MOS transistor, has a high speed path, a low speed path and a switch-over controlling circuit for switching between said high speed path and said low speed path.

4. A non-volatile semiconductor memory claimed in claim 3 wherein a selective connection between either said high speed path or said low speed path and each of said gate input signal driving circuit for said P-channel MOS transistor and said gate input signal driving circuit for said N-channel MOS transistor, is controlled by a mode discriminating circuit.

5. A non-volatile semiconductor memory including an output circuit having a P-channel MOS transistor having a source thereof connected to a power supply and an N-channel MOS transistor having a source thereof connected to ground, drains of said P-channel MOS transistor and said N-channel MOS transistor being connected in common so as to form a final output, the semiconductor memory having an ordinary data reading mode and a programming mode accompanied with a verify operation, and the semiconductor memory also including gate input signal driving circuits for driving a gate of said P-channel MOS transistor and a gate of said N-channel MOS transistor, characterized in that, in said verify operation, each of said gate input signal driving circuit for said P-channel MOS transistor and said gate input signal driving circuit for said N-channel MOS transistor, comprises a high cut filter for attenuating a predetermined high frequency component.

* * * * *